United States Patent [19]

Buckler

[11] Patent Number: 4,588,277

[45] Date of Patent: May 13, 1986

[54] WATERLESS LITHOGRAPHIC PLATE PROCESSOR

[76] Inventor: Robert Buckler, P.O. Box 2127, Mansfield, Ohio 44905

[21] Appl. No.: 623,111

[22] Filed: Jun. 22, 1984

[51] Int. Cl.$^4$ ............................................... G03D 5/00
[52] U.S. Cl. .................... 354/317; 354/319; 354/324; 15/77; 104/463.1
[58] Field of Search ............... 354/317, 319, 324, 325, 354/322; 15/77, 100; 101/463.1

[56] References Cited

U.S. PATENT DOCUMENTS

| | | | |
|---|---|---|---|
| 3,593,641 | 7/1971 | Adams | 354/317 |
| 3,846,816 | 11/1974 | Gaisser | 354/317 |
| 3,916,426 | 10/1975 | Bown | 354/325 |
| 3,983,758 | 10/1976 | Hovekamp | 101/463.1 |
| 4,128,326 | 12/1978 | Selak | 354/317 |
| 4,145,135 | 3/1979 | Sara | 354/324 |

Primary Examiner—A. A. Mathews
Attorney, Agent, or Firm—Robert Bruce Henn

[57] ABSTRACT

Apparatus for processing plates for waterless lithographic printing comprises a first and second pair of driving rollers and washing tray in a first zone, a third and fourth pair of driving rollers and reciprocating brushing roller in a second zone, a fifth and sixth pair of driving rollers and a finishing roller in a third zone, and a seventh pair of rollers serving as an exit-drive means; a plurality of tanks is provided for holding treating solutions, with pump means for applying the solutions to the plate in the respective zones. The reciprocating brush is constructed to have a minimum mass, to impart as little vibration to the apparatus as possible.

7 Claims, 2 Drawing Figures

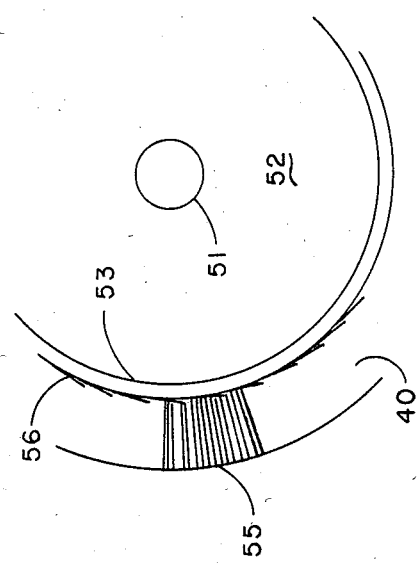
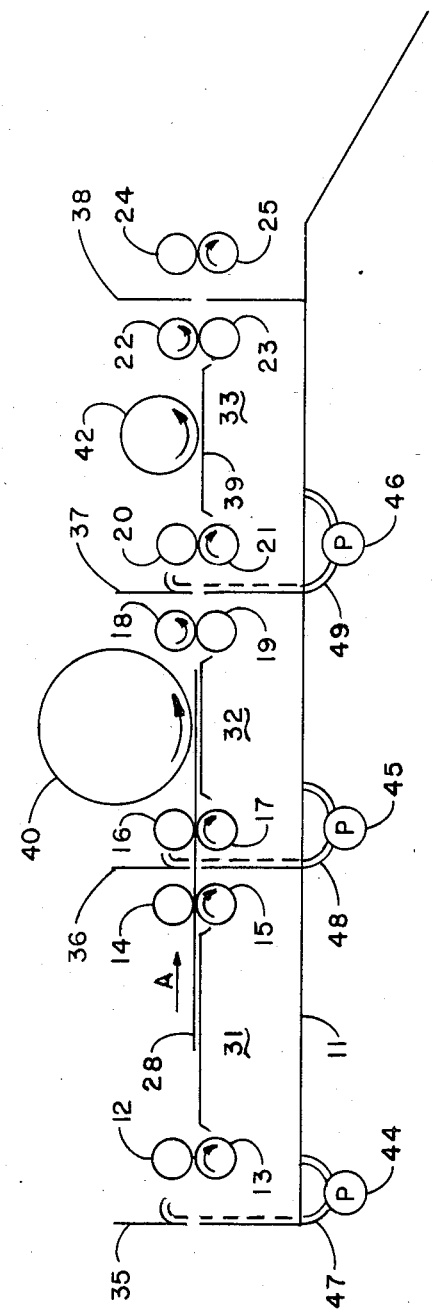
Fig.2
Fig.1

WATERLESS LITHOGRAPHIC PLATE PROCESSOR

BACKGROUND OF THE INVENTION

1. Field of the Invention

The present invention is in the field of automatic processors for lithographic plates. More particularly, this invention is in the field of automatic processors for plates for waterless lithographic printing.

2. Description of the Prior Art

Machines for the automatic processing of lithographic plates are known in the art. Such machines effect various kinds of actions on the surface of the plate, including washing, scrubbing and gum application. Earlier machines have been large, complicated and heavy, but more modern developments have tended toward lighter and more versatile processors.

Among the lighter machines are included the apparatus described in U.S. Pat. No. 3,983,758 to Hovekamp, assigned to the assignee of the present invention. Hovekamp describes a processor which sequentially develops, washes and applies gum to an exposed offset lithographic plate yet is small enough to fit through a standard one-meter-wide doorway, and is sufficiently simple mechanically to permit personnel without extensive training to service such machines.

In recent time, there has been developed a plate for offset lithography which permits printing to be done without the need for water in the process. Such a plate has a transparent protecting film over a silicone polymer which in turn overlies a photosensitive layer. The balance of the plate is similar to existing lithography plates, and exposure of the plate in preparation for subsequent printing is the same as with prior-art plates.

In the processing of the exposed waterless plate, a different series of steps from that now used in the art is required. Machinery is available to do this function, but a lower-cost, more easily maintainable machine is desirable.

SUMMARY OF THE INVENTION

The present invention is an apparatus for processing photolithographic plates for waterless printing comprising a first and second pair of drive rollers, a solutin tank, a third and fourth pair of drive rollers and a reciprocating or oscillating brush disposed in a treating tank, a fifth and sixth pair of drive rollers and a rotating brush in a dye tank, a pair of exit rollers, each pair of rollers serving both as a drive and a squeegee to minimize carryover of liquid from one tank to another or to prevent the exit of liquid on the plate after processing, and pump means to distribute treating liquid onto the surface of the plate being treated.

BRIEF DESCRIPTION OF THE DRAWINGS

FIG. 1 is an elevation of the apparatus of the present invention.

FIG. 2 is a detail showing the reciprocating brush mounted in the treating tank.

DESCRIPTION OF THE PREFERRED EMBODIMENTS

The preferred embodiment of the present invention is an apparatus for processing photolithographic plates for waterless printing comprising a first pair of drive rollers, a solution tank, a second pair of drive rollers, a third pair of drive rollers, a treating tank, a reciprocating brush, a fourth pair of drive rollers, a fifth pair of drive rollers, a dye tank, a rotating brush, a sixth pair of drive rollers, and a pair of exit rollers, each pair of rollers serving both as a drive and a squeegee to minimize carryover of liquid from one tank to another or to prevent the exit of liquid on the plate after processing. The mounting for the reciprocating brush is secured directly to the frame of the apparatus in such fashion that only the brush itself and the shaft on which it is disposed are movable linearly. The brush is made of lightweight materials to reduce vibration caused by the reciprocation of the mass of the brush. Means are provided to distribute treating fluid onto the plate being treated.

Turning now to FIG. 1, the apparatus of the invention comprises a mounting frame 11 on which are mounted rollers 12 through 25, discussed more fully hereinbelow in connection with their particular functions.

The apparatus is divided into three zones, pre-treating zone 31, developing zone 32 and dyeing zone 33; each zone comprises a tank in which appripriate solutions are maintained and recirculated. Zone 31 is defined by first pair of rollers 12 and 13, wall 35, second pair of rollers 14 and 15, and wall 36. Zone 32 is defined by third pair of rollers 16 and 17, wall 36, fourth pair of rollers 18 and 19, and wall 37. Third zone 33 is defined by fifth pair of rollers 20 and 21, wall 37, sixth pair of rollers 22 and 23, and wall 38. Seventh pair of rollers 24 and 25 serve to maintain tension on the plate as it passes through the apparatus, in order to prevent buckling or other deformation, and to drive the finished sheet from the apparatus.

Each roller 12 through 25 is preferably composed of a shaft covered with an elastomeric material such as, e.g., natural, butyl, or EPDM rubber or the like. The thickness of the elastomeric covering is not critical to the operation of this invention, but should be sufficient to permit the roller to engage the surface of the lithographic plate without either slippage or distortion of the plate.

The hardness of the elastomeric covering of rollers 12 through 25 is preferably about a Shore Durometer B 40 to 60, although values as low as about 25 and as high as about 70 are within the spirit and scope of this invention. In one embodiment of this invention, the hardness of the elastomeric covering on each pair of rollers decreases from first pair 12 and 13 through seventh pair 24 and 25. In this fashion, the ability of each succeeding pair of rollers to exert tension on the plate is greater than the previous pair, minimizing or eliminating the possibility of the plate being driven from behind more forcefully than the lead pair of rollers can move it. This arrangement minimizes any tendency toward buckling of the plate from being over-driven from the rear, and makes alignment of the plate through the apparatus effectively trouble-free.

Oscillating roller 40 serves to remove the silicone-rubber layer as the plate passes through zone 32, as more fully set forth hereinbelow. Finishing roller 42 in zone 33 distributes a finishing dye unto the surface of the plate to complete the processing.

Solutions within the respective treating zones are recirculated or applied to the lithographic plate under treatment by means of pumps 44, 45 and 46 through pipes or tubing 47, 48 and 49. Such means are well known to those skilled in the art, and need no further description herein.

Motive means for driving the rollers and recirculation means of the present apparatus comprise electric motors suitably connected by means of belts, timing chains or other power-transfer means well known to those skilled in the art, and form no part of this invention as such.

In the operation of the apparatus of this invention, an exposed lithographic plate 28 in FIG. 1 is driven in the direction indicated by the arrow A by the action of the rollers. As viewed in FIG. 1, each of the odd-numbered rollers is moving clockwise, and each even-numbered roller is moving counter-clockwise, serving to transport plate 28 from left to right in the drawing. In zone 31, the transparent protective film is softened by the action of a chemical solution.

The plate passes to zone 32 by the action of rollers 14 through 16, and passes under oscillating roller 40, which removes the protecting film and works in the developer which is carried in zone 32.

Plate 28 is then carried to zone 33 by the action of rollers 18 through 21. In zone 33, finishing roller 42 brushes a dye onto plate 28, the dye serving both to fix the image and to provide a visible image for use in further handling of the plate. After the fixing and dying step, rollers 24 and 25 transport plate 28 out of the apparatus for drying and further printing operations not the subject of this invention.

During the processing steps described herein, plate 28 is supported in part by the rollers transporting it and by backing means 39 in each treating zone.

FIG. 2 shows oscillating roller 40 in greater detail. In the operation of the apparatus of the present invention, brush 40 both rotates about shaft 51 and moves reciprocally in a linear fashion on that shaft. Brush 40 is therefore constructed with as little mass as is feasible in order to minimize vibration of the apparatus during its operation. Hub 52 of brush 40 is therefore chosen from a material which has adequate strength but a low mass; such materials can include, e.g., high-density polyethylene or propylene, polytetrafluoroethylene, polycarbonates and the like. Core 53 is made of a material with similar characteristics as hub 52, although the requirement for strength is not as great as for the hub; suitable materials for core 53 comprise, e.g., poly(vinyl chloride), polyamides, polystyrene and the like.

The bristle portion 55 of brush 40 comprises bristles twisted into a wire pair 56, and the resultant construction wound spirally on core 53. The terminals of bristle portion 55 are secured by means well known to those skilled in the art, and form no part of this invention as such.

Modifications, changes and improvements to the present forms of the invention herein disclosed, described and illustrated may occur to those skilled in the art who come to understand the principles and precepts thereof. Accordingly, the scope of the patent to be issued hereon should not be limited to the particular embodiments of the invention set forth herein, but rather should be limited only to the advance by which the invention has promoted the art.

I claim:

1. Apparatus for processing photolithographic plates for waterless printing comprising a frame, a first pair of drive rollers, a solution zone, a second pair of drive rollers, a third pair of drive rollers, a treating zone, a reciprocating brush, a fourth pair of drive rollers, a fifth pair of drive rollers, a dye zone, a rotating brush, a sixth pair of drive rollers, a pair of exit rollers, each pair of rollers mounted on said frame and serving both as a drive and a squeegee to minimize carryover of liquid from one tank to another and to prevent the exit of liquid on said plate after processing, pump means for circulating treating fluid to each tank, and motive means for driving said pump mans, rollers and brushes.

2. The apparatus of claim 1 wherein said rollers have an elastomeric covering on a metal core.

3. The apparatus of claim 2 where each succeesive pair of rollers has a softer coating than the previous pair.

4. The apparatus of claim 1 wherein said oscillating roller is mounted directly to said frame.

5. The apparatus of claim 1 wherein said oscillating brush comprises a hub mounted on a shaft and a core disposed on said hub.

6. The apparatus of claim 5 wherein said hub is formed of high-density polyethylene and said core is formed of poly(vinyl chloride).

7. The apparatus of claim 6 wherein said oscillating brush has a core formed of high-density polypropylene.

* * * * *